(12) United States Patent
Matsuo et al.

(10) Patent No.: US 10,958,054 B2
(45) Date of Patent: Mar. 23, 2021

(54) POWER CONVERSION DEVICE

(71) Applicant: Mitsubishi Electric Corporation, Tokyo (JP)

(72) Inventors: Yoichi Matsuo, Tokyo (JP); Kenta Takeshima, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/771,045

(22) PCT Filed: Apr. 10, 2019

(86) PCT No.: PCT/JP2019/015696
§ 371 (c)(1),
(2) Date: Jun. 9, 2020

(87) PCT Pub. No.: WO2020/208757
PCT Pub. Date: Oct. 15, 2020

(65) Prior Publication Data
US 2020/0412117 A1 Dec. 31, 2020

(51) Int. Cl.
*H02G 3/14* (2006.01)
*H02M 7/12* (2006.01)
(Continued)

(52) U.S. Cl.
CPC ............... *H02G 3/14* (2013.01); *H02M 7/12* (2013.01); *H02M 7/48* (2013.01); *H05K 5/0247* (2013.01); *H05K 5/03* (2013.01); *H05K 7/02* (2013.01)

(58) Field of Classification Search
CPC ............ H02G 3/14; H02G 3/08; H02G 3/081; H02G 3/088; H02M 7/12; H02M 7/48;
(Continued)

(56) References Cited

U.S. PATENT DOCUMENTS

| 4,654,470 A * | 3/1987 | Feldman | ............... H02G 3/088 174/50 |
| 6,911,600 B2 * | 6/2005 | Kiyota | ............... H02G 3/088 16/2.1 |

(Continued)

FOREIGN PATENT DOCUMENTS

| JP | 50-49696 U | 5/1975 |
| JP | 52-152386 U | 11/1977 |

(Continued)

OTHER PUBLICATIONS

Decision to Grant a Patent issued in Japanese Application No. 2019-547721, dated Jan. 7, 2020.
(Continued)

*Primary Examiner* — Angel R Estrada
(74) *Attorney, Agent, or Firm* — Birch, Stewart, Kolasch & Birch, LLP

(57) ABSTRACT

A power conversion device includes a wire connected to an electrical component, a casing to accommodate therein the electrical component, the casing being provided with an opening through which the wire is led out, a cover component removably attached to an exterior of the casing to cover the opening, and provided with a wiring hole through which the wire passes, and a pressing plate that is a fixing component to fix the wire inside the cover component. The cover component is attachable in two or more different orientations.

8 Claims, 9 Drawing Sheets

(51) Int. Cl.
*H02M 7/48* (2007.01)
*H05K 5/02* (2006.01)
*H05K 5/03* (2006.01)
*H05K 7/02* (2006.01)

(58) Field of Classification Search
CPC .......... H05K 5/0247; H05K 5/03; H05K 7/02; H05K 5/04
USPC ......... 174/66, 67, 50, 520, 40 CC, 480, 482, 174/481, 490, 487, 535; 220/3.2, 3.3, 220/241, 242; 248/68.1, 49
See application file for complete search history.

(56) References Cited

U.S. PATENT DOCUMENTS

| | | | |
|---|---|---|---|
| 9,214,792 B2 * | 12/2015 | Kakimi | H02G 3/088 |
| 9,742,169 B1 * | 8/2017 | Matsumura | H02G 3/0633 |
| 10,283,949 B2 * | 5/2019 | Thomas | H02G 3/088 |
| 2012/0222880 A1 | 9/2012 | Dinh | |

FOREIGN PATENT DOCUMENTS

| | | |
|---|---|---|
| JP | 1-244698 A | 9/1989 |
| JP | 4-131976 U | 12/1992 |
| JP | 9-46066 A | 2/1997 |
| JP | 9-223876 A | 8/1997 |
| JP | 11-186751 A | 7/1999 |
| JP | 2018-50380 A | 3/2018 |
| JP | 2018-85470 A | 5/2018 |
| WO | WO 2012/086030 A1 | 6/2012 |

OTHER PUBLICATIONS

Notification of Reason for Refusal issued in Japanese Application No. 2019-547721, dated Oct. 29, 2019.

* cited by examiner

POWER CONVERSION DEVICE

FIELD

The present invention relates to a power conversion device that transmits and receives power through a wire led out of a casing.

BACKGROUND

There is a commonly-known power conversion device that is connected to an external device such as an electric vehicle having a storage battery installed therein, and that performs power conversion for charging the storage battery from a commercial power supply and power conversion for power feed from the storage battery to a house. A connector is provided at the end of a wire led out of, or withdrawn from, a casing of the power conversion device. The connector is used to connect the wire to the external device. The connector provided at the end of the wire is fitted into a connector of the external device, so that the power conversion device can transmit and receive power to and from the external device.

Patent Literature 1 discloses a charger including a charging cable led out, or withdrawn, from the right side panel of the casing. The casing is constituted by the front panel, the back panel, the right side panel, the left side panel, and the top panel. In the charger disclosed in Patent Literature 1, the charging cable that is a wire used to transmit and receive power is led out from a portion of the right side panel closer to the top panel in a direction perpendicular to the right side panel.

CITATION LIST

Patent Literature

Patent Literature 1: Japanese Patent Application Laid-open No. 2018-50380

SUMMARY

Technical Problem

In some power conversion devices, a wire may also be provided in the same manner as in the charger disclosed in Patent Literature 1. It is supposed that a wire is led out from the right side of the casing of the power conversion device in a direction perpendicular to the right side. There may be a case where an obstruction, such as a building wall or an existing object, is present on the right side of the location where the power conversion device is installed. In that case, it is necessary to route the wire, led out of the casing in the direction perpendicular to the right side of the casing, in such a manner as to bypass the obstruction. Moreover, there may be a case where a connector of the external device is present on the left side of the location where the power conversion device is installed. In that case, it is necessary to route the wire, led out of the casing in the direction perpendicular to the right side of the casing, toward the left side of the installation location. As described above, in order to orient the wire in a direction other than the direction in which the wire is led out of the casing, wire routing work is needed. This increases the workload during wire-connection work. The wire is also required to have an excess length for routing the wire outside of the casing. As described above, the conventional power conversion devices provided with a wire in the same manner as in the configuration disclosed in Patent Literature 1 have a problem in that the workload in connecting the wire to the external device may be increased and a longer wire is needed for routing the wire.

The present invention has been achieved to solve the above problems, and an object of the present invention is to provide a power conversion device that makes it possible to reduce the workload in connecting a wire to an external device and to reduce the length of the wire to be led out to the outside of a casing.

Solution to Problem

In order to solve the above problems and achieve the object, a power conversion device according to an aspect of the present invention includes: a wire connected to an electrical component; a casing to accommodate the electrical component, the casing being provided with an opening through which the wire is led out; a cover component removably attached to an exterior of the casing to cover the opening, and provided with a wiring hole through which the wire passes; and a fixing component to fix the wire inside the cover component. The cover component is attachable in two or more different orientations.

Advantageous Effects of Invention

The power conversion device according to the present invention has an effect where it is possible to reduce the workload in connecting a wire to an external device and to reduce the length of the wire to be led out to the outside of a casing.

DESCRIPTION OF EMBODIMENTS

A power conversion device according to embodiments of the present invention will be described in detail below with reference to the accompanying drawings. The present invention is not limited to the embodiments.

First Embodiment

Figure 1:
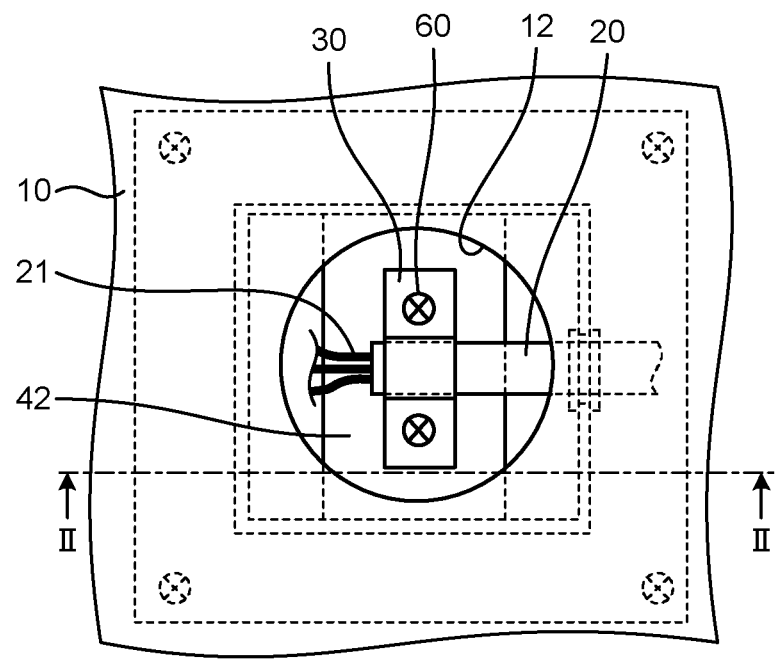
FIG. 1 is a plan view illustrating a wire lead-out structure of a power conversion device according to a first embodiment of the present invention.
Figure 2:
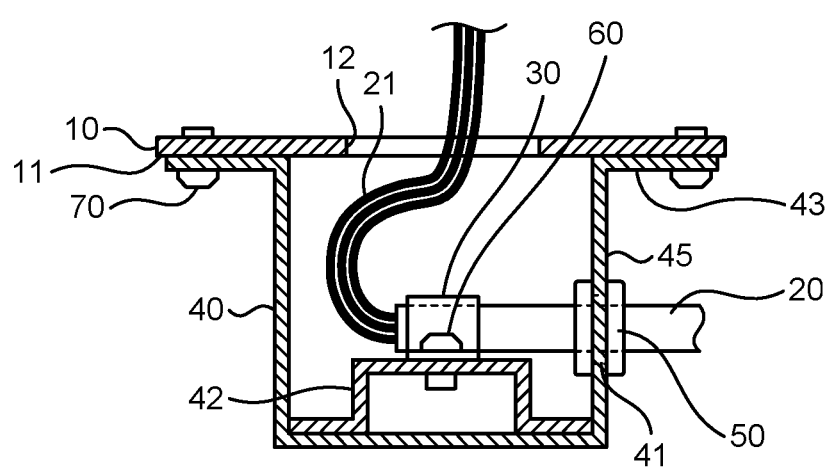
FIG. 2 is a cross-sectional view taken along line II-II illustrated in FIG. 1.
Figure 3:
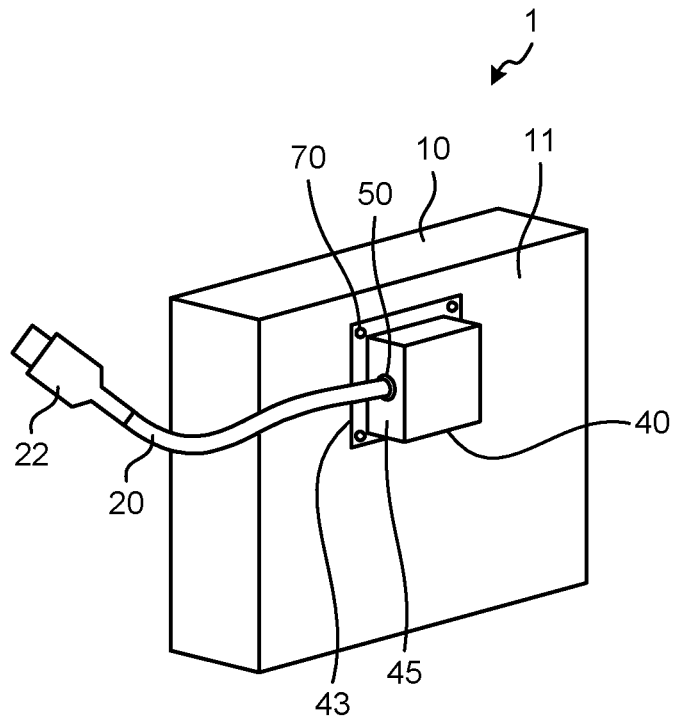
FIG. 3 is a first perspective view illustrating the power conversion device according to the first embodiment.
Figure 4:
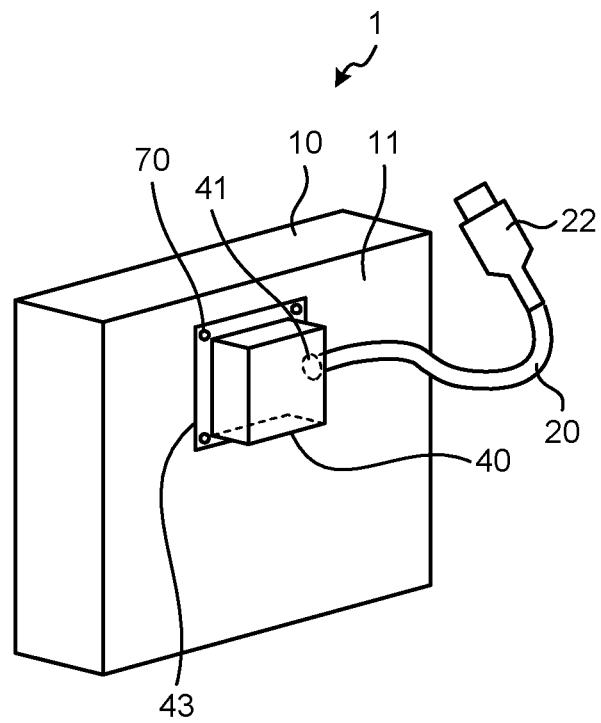
FIG. 4 is a second perspective view illustrating the power conversion device according to the first embodiment.
Figure 5:
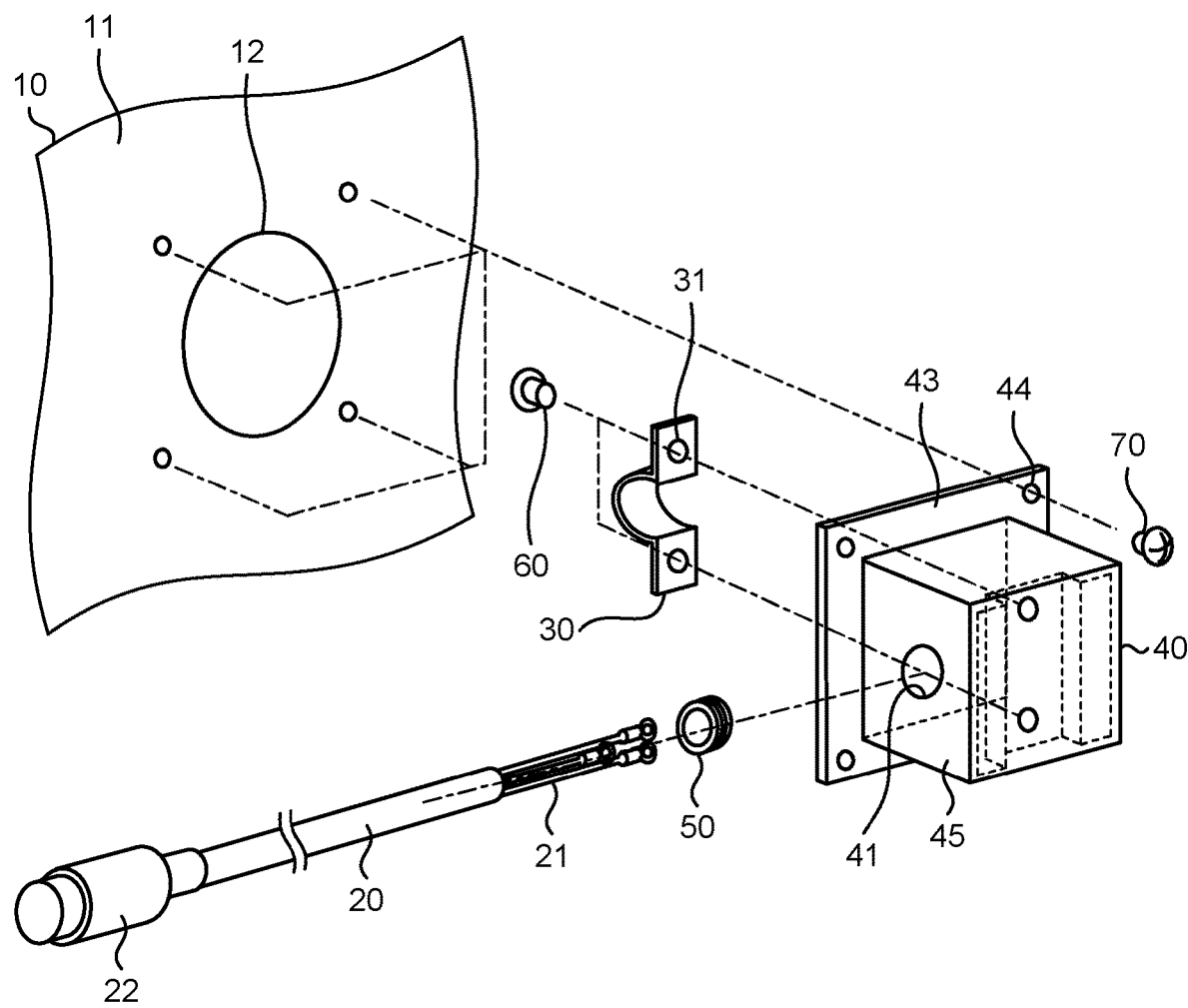
FIG. 5 is an exploded view illustrating the wire lead-out structure of the power conversion device according to the first embodiment.

FIG. 1 is a plan view illustrating a wire lead-out structure of a power conversion device according to a first embodiment of the present invention. FIG. 2 is a cross-sectional view taken along line II-II illustrated in FIG. 1. FIG. 3 is a first perspective view illustrating the power conversion device according to the first embodiment. FIG. 4 is a second perspective view illustrating the power conversion device according to the first embodiment. FIG. 5 is an exploded view illustrating the wire lead-out structure of the power conversion device according to the first embodiment.

A power conversion device 1 is connected to an external device having a storage battery installed therein. The power conversion device 1 performs AC to DC power conversion for charging the storage battery from a commercial power supply, and performs DC to AC power conversion for power feed from the storage battery to a load in a house. The external device is an electric vehicle or other devices. The load in the house is a household electrical appliance or other devices.

The power conversion device 1 includes a casing 10 that accommodates therein an electrical component that performs AC to DC power conversion and DC to AC power conversion, and a cover component 40 removably attached to the exterior of the casing 10. The casing 10 is a cuboid-shaped box member. A mounting surface 11, which is one of the surfaces constituting the casing 10, is provided with an opening 12 through which a wire 20 is led out. One end of the wire 20 is connected to the electrical component within the casing 10. The other end of the wire 20 is provided with a connector 22 used for connecting the wire 20 to the external device. FIG. 1 illustrates a section of the casing 10 where the opening 12 is provided, when viewed from the inside of the casing 10. The opening 12 has a round shape.

The cover component 40 is attached to the exterior of the casing 10 to cover the opening 12. The cover component 40 is a cuboid-shaped box member with an open side that is in contact with the casing 10. A flange 43 is provided at the edge of the open side of the cover component 40. The flange 43 comes into contact with the mounting surface 11 in a state where the cover component 40 is attached to the casing 10.

At each of the four corners of the flange 43, a hole 44 is provided through which a screw 70 passes. The hole 44 is located at a position corresponding to each of the four corners of the square. The screws 70 that have passed through the holes 44 are screwed into the casing 10, and thereby the cover component 40 is fixed to the casing 10. The cover component 40 is fixed to the casing 10, so that the opening 12 is covered in its entirety by the cover component 40. In the state where the cover component 40 is fixed to the casing 10, when the screws 70 are loosened, the cover component 40 is detached from the casing 10.

The cover component 40 is provided with a wiring hole 41 through which the wire 20 passes. The wiring hole 41 is provided in a surface 45 which is one of the surfaces of the cover component 40. The surface 45 is one of the surfaces of the cover component 40 that are perpendicular to the mounting surface 11. The wire 20 passes through the wiring hole 41, and is thus led out of the interior of the cover component 40 in a direction parallel to the mounting surface 11.

A bush 50 is attached to the wiring hole 41 to fill the space between the outer periphery of the wiring hole 41 and the wire 20. Providing the bush 50 prevents the wire 20 from being damaged by coming into contact with the outer periphery of the wiring hole 41. Providing the bush 50 also prevents foreign matter such as water and dust from entering the interior of the cover component 40.

A seat 42 is provided on the inner surface of the cover component 40 facing the opening 12. The seat 42 is a plate member with bends. The seat 42 is joined to the inner surface of the cover component 40 and is thus formed integrally with the cover component 40.

A pressing plate 30 is attached to the seat 42. The pressing plate 30 is a fixing component that fixes the wire 20 inside the cover component 40. The part of the seat 42, to which the pressing plate 30 is attached, protrudes toward the casing 10 relative to the other part of the seat 42 which is joined to the inner surface of the cover component 40. The pressing plate 30 is a flat spring including a curved portion into which the wire 20 can be fitted. The cover component 40, the seat 42, and the pressing plate 30 constitute the wire lead-out structure provided in a section where the wire 20 is led out of the casing 10.

The pressing plate 30 is provided with holes 31 through which screws 60 pass. In a state where the wire 20 is fitted into the pressing plate 30, the screws 60 that have passed through the holes 31 are screwed into the seat 42, so that the pressing plate 30 is fixed to the seat 42 with the wire 20 being pressed against the seat 42. The wire 20 is retained in the interior of the cover component 40 by the pressing plate 30 fixed to the seat 42.

A plurality of wires 21 are bundled with each other inside the wire 20. The wires 21 include a power supply line used for transmitting and receiving power to and from the external device, and a signal line used for communicating with the external device. Each of the wires 21 is covered with a sheath. The wire 20 includes an outer sheath that is an exterior component that covers a bundle of the wires 21. The outer sheath is removed from a part of the wire 20 which is situated closer to the electrical component than the position where the wire 20 is pressed by the pressing plate 30. Thus, the wires 21 in that part of the wire 20 become unbundled. Each of the wires 21 is connected to the electrical component located inside the casing 10. In FIGS. 1 and 2, each of the wires 21 is shown in solid black color.

In a state where the cover component 40 is fixed to the casing 10, when all the screws 70 are loosened, the cover component 40 is detached from the casing 10. Since the wire 20 is fixed to the cover component 40, even in a state where the cover component 40 is detached from the casing 10, the cover component 40 is still connected with constituent elements within the casing 10 through the wire 20 and the wires 21. In a state where the cover component 40 is detached from the casing 10, when the cover component 40 is rotated about the position at which the pressing plate 30 presses against the wire 20, then the orientation of the wire 20 led out of the cover component 40 can be changed. The cover component 40 is attachable in two or more different orientations so that it can change the orientation of the wire 20.

In the state illustrated in FIG. 3, the surface 45 of the cover component 40, in which the wiring hole 41 is provided, is oriented leftward when viewed from the position facing the mounting surface 11. The wire 20 is led out of the cover component 40 in the leftward direction. When the cover component 40 is detached from the mounting surface 11 by loosening all the screws 70 in the state illustrated in FIG. 3, then the cover component 40 can be moved to such an extent that each of the wires 21 connected to the electrical component within the casing 10 can be fully extended. Loosening all the screws 70 brings the cover component 40 into a rotatable state.

The cover component 40 is rotated in the clockwise direction by 90 degrees from the state illustrated in FIG. 3, and thereby the orientation of the wire 20 is changed from leftward to upward. The cover component 40 is rotated in the counterclockwise direction by 90 degrees from the state illustrated in FIG. 3, and thereby the orientation of the wire 20 is changed from leftward to downward. The cover component 40 is rotated in the clockwise direction or counterclockwise direction by 180 degrees from the state illustrated in FIG. 3, and thereby the orientation of the wire 20 is changed from leftward to rightward. The clockwise direction and the counterclockwise direction are defined as a direction when viewed from the position facing the mounting surface 11. The wiring hole 41 is provided in the surface 45 which is one of the surfaces of the cover component 40 that are perpendicular to the mounting surface 11. Thus, by rotation of the cover component 40, the orientation of the wire 20 can be changed in a direction parallel to the mounting surface 11.

When the cover component 40 is rotated by 90 degrees from the state illustrated in FIG. 3 and when the cover component 40 is rotated by 180 degrees from the state illustrated in FIG. 3, the positions of the holes 44 in the cover component 40 are still respectively aligned with the positions of the holes in the mounting surface 11 through which the screws 70 are screwed. Therefore, it is possible to fix the cover component 40 to the mounting surface 11 in each of the states where the wire 20 is oriented leftward, where the wire 20 is oriented upward, where the wire 20 is oriented downward, and where the wire 20 is oriented rightward. As described above, in the first embodiment, the cover component 40 is attachable in four different orientations. FIG. 4 illustrates the fixed state of the cover component 40 with the wire 20 oriented rightward.

Each of the wires 21 has a length greater than the distance between the position of the pressing plate 30 and the position of the electrical component to which the wire 21 is connected. Each of the wires 21 has a sufficient length as described above, so that the cover component 40 can be rotated while being spaced apart from the mounting surface 11. The cover component 40 can be rotated without coming into contact with the mounting surface 11. This can reduce the probability of the cover component 40 and the mounting surface 11 being damaged due to their contact with each other.

In the power conversion device 1, it is possible to appropriately change the orientation of the wire 20. Accordingly, regardless of in which direction, when viewed from the power conversion device 1, an obstruction is present, it is possible for the power conversion device 1 to easily locate the wire 20 while bypassing the obstruction. Moreover, regardless of in which direction, when viewed from the power conversion device 1, a connector of the external device is provided, it is possible for the power conversion device 1 to easily locate the wire 20 such that the wire 20 is directed toward the connector of the external device.

It is possible to select a direction in which the wire 20 is led out of the casing 10. Thus, even though the product lineup does not include the power conversion devices 1 in which the positions from which the wire 20 is led out are different, the power conversion device 1 can still be used by leading out the wire 20 in a given direction in accordance with the installation location or the position of the external device. It is possible for the power conversion device 1 to lead out the wire 20 in any direction, and this makes it possible to install the power conversion device 1 with less limitations.

It is possible for the power conversion device 1 to change the direction in which the wire 20 is led out in accordance with the installation location or the position of the external device, and this reduces the length of the wire 20 to be routed for bypassing an obstruction or for connecting the wire 20 to the connector of the external device. Due to the reduced length of the wire 20 to be routed, the power conversion device 1 can reduce the workload in connecting the wire 20 to the external device. Due to the reduced length of the wire 20 to be routed, the power conversion device 1 can also avoid the situation where the wire 20 may become an obstruction around the installation location of the power conversion device 1.

Due to the reduced length of the wire 20 to be routed, the power conversion device 1 can reduce the excess length of the wire 20. Accordingly, the entire length of the wire 20 can be reduced. The power conversion device 1 can reduce the likelihood that the length of the wire 20 becomes insufficient. The cover component 40 is not limited to being attachable in four different orientations. It suffices that the cover component 40 is attachable in at least a plurality of different orientations. It is allowable that the cover component 40 is attachable in two or three different orientations.

According to the first embodiment, the power conversion device 1 includes the cover component 40 removably attached to the exterior of the casing 10 to cover the opening 12, and the pressing plate 30 that fixes the wire 20 inside the cover component 40. The cover component 40 is attachable in two or more different orientations. In the power conversion device 1, the cover component 40 is rotatable about the position at which the pressing plate 30 presses against the wire 20, so that the direction in which the wire 20 is led out can be easily changed. Due to this structure, the power conversion device 1 achieves the effects of being capable of reducing the workload in connecting the wire 20 to the external device and reducing the length of the wire 20.

Second Embodiment

Figure 6:
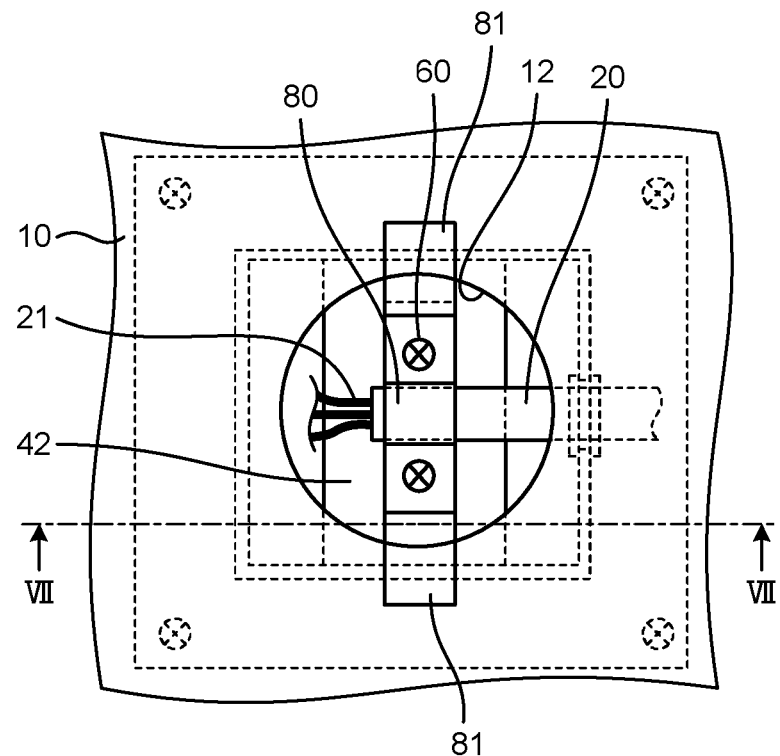
FIG. 6 is a plan view illustrating a wire lead-out structure of a power conversion device according to a second embodiment of the present invention.
Figure 7:
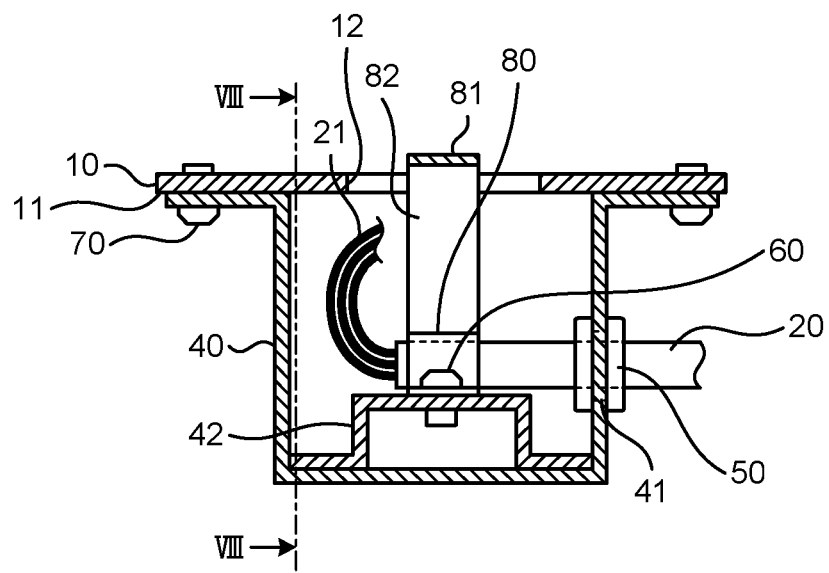
FIG. 7 is a cross-sectional view taken along line VII-VII illustrated in FIG. 6.
Figure 8:
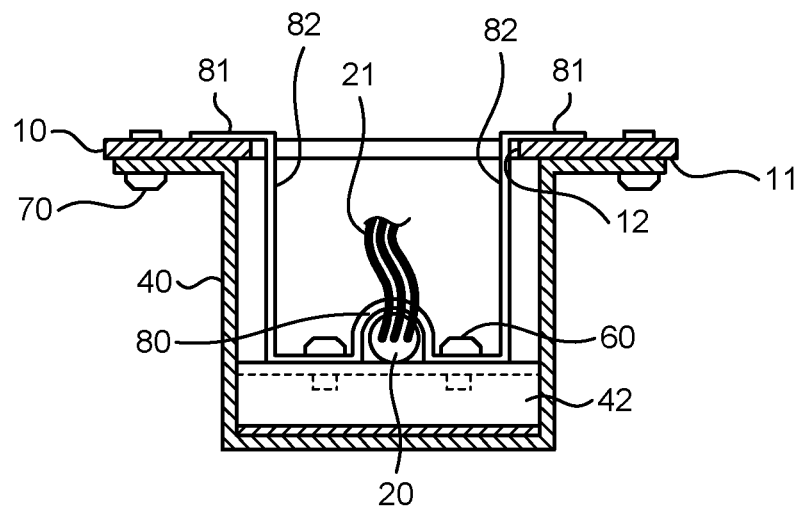
FIG. 8 is a cross-sectional view taken along line VIII-VIII illustrated in FIG. 7.

FIG. 6 is a plan view illustrating a wire lead-out structure of a power conversion device according to a second embodiment of the present invention. FIG. 7 is a cross-sectional view taken along line VII-VII illustrated in FIG. 6. FIG. 8 is a cross-sectional view taken along line VIII-VIII illustrated in FIG. 7. In the second embodiment, the power conversion device 1 has a wire lead-out structure that includes a stopper plate 80 instead of the pressing plate 30 illustrated in FIG. 1. The stopper plate 80 includes a flat spring portion similar to the pressing plate 30. In the second embodiment, like constituent elements as those of the first embodiment are denoted by like reference signs and configurations different from those of the first embodiment are mainly described.

The stopper plate 80 is a fixing component that fixes the wire 20 inside the cover component 40. The flat spring portion of the stopper plate 80 is attached to the seat 42. The flat spring portion is provided with the holes 31 through which the screws 60 pass. The cover component 40, the seat 42, and the stopper plate 80 constitute the wire lead-out structure provided in a section where the wire 20 is led out of the casing 10.

The stopper plate 80 includes wall portions 82 that extend from the opposite ends of the flat spring portion toward the interior of the casing 10, and bent portions 81 that are bent and extend from the wall portions 82. The bent portions 81 are provided at the opposite end portions of the stopper plate 80. In a state where the flat spring portion is attached to the seat 42, the bent portions 81 face the inner surface of the casing 10 that is the surface opposite to the mounting surface 11. The stopper plate 80 is disposed such that the wall portions 82 extend across the interior of the cover component 40 and the interior of the casing 10 through the opening 12.

In a state where the cover component 40 is fixed to the casing 10, when all the screws 70 are loosened, fixing of the cover component 40 to the casing 10 is released. Even when fixing of the cover component 40 to the casing 10 is released, the bent portions 81 are still held by the inner surface of the casing 10. This prevents the cover component 40 from separating from the casing 10 in a direction perpendicular to the mounting surface 11. In a case where the cover component 40 is moved in a direction parallel to the mounting surface 11, the wall portions 82 come into contact with the outer periphery of the opening 12. For this reason, the movement of the cover component 40 in a direction parallel to the mounting surface 11 is limited within the range defined by the opening 12. When fixing of the cover component 40 to the casing 10 is released, the cover component 40 is rotatable about the position at which the flat spring portion presses against the wire 20.

Each of the wires 21 has a length greater than the distance between the position of the stopper plate 80 and the position of the electrical component connected to the wire 21. Each of the wires 21 has such a length as to prevent the wire 21 from being pulled excessively tight when the bundle of the wires 21 is twisted by rotation of the cover component 40. The state of the cover component 40 in which each of the wires 21 is not pulled tight is defined as a reference state. If the cover component 40 is rotatable in the clockwise direction by 180 degrees from the reference state and is rotatable in the counterclockwise direction by 180 degrees from the reference state, then the power conversion device 1 can lead out the wire 20 in any direction. For example, the reference state is a state in which a bundle of the wires 21 is not twisted. Each of the wires 21 has a set length so as to prevent the wire 21 from being pulled excessively tight even when the cover component 40 is rotated by 180 degrees from the reference state. Thus, even when the direction in which the wire 20 is led out is changed, the power conversion device 1 can prevent an excessive stress from being applied to each of the wires 21.

In the second embodiment, the stopper plate 80 is attached to the cover component 40; therefore, when fixing of the cover component 40 to the casing 10 is released, movement of the cover component 40, except rotation, is limited. The power conversion device 1 is provided with the stopper plate 80, and thus can reduce the likelihood that each of the wires 21 is damaged by being pulled tight by rotation of the cover component 40, while allowing rotation of the cover component 40 intended to change the orientation of the wire 20.

Third Embodiment

Figure 9:
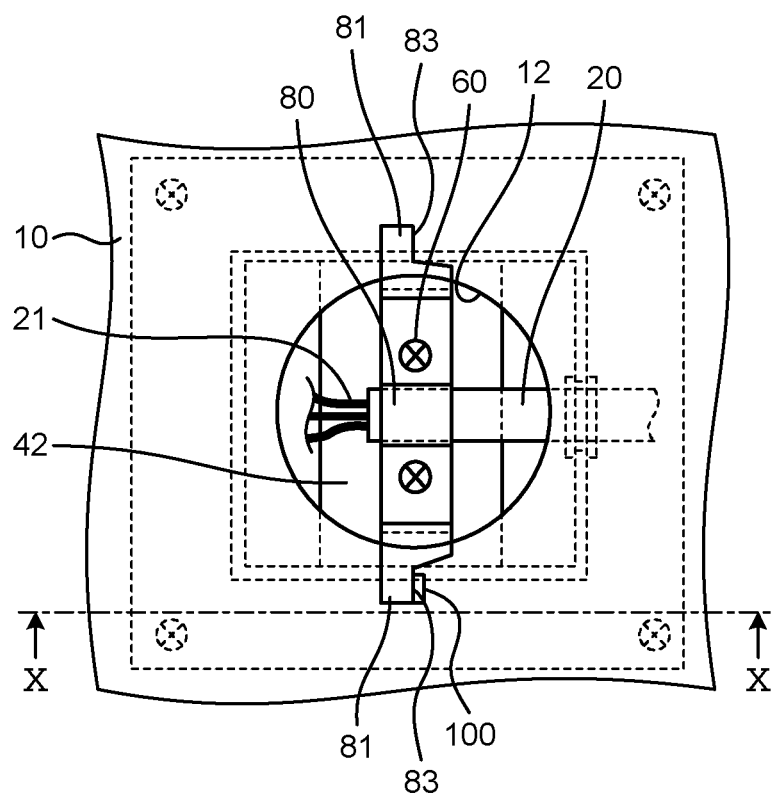
FIG. 9 is a plan view illustrating a wire lead-out structure of a power conversion device according to a third embodiment of the present invention.
Figure 10:
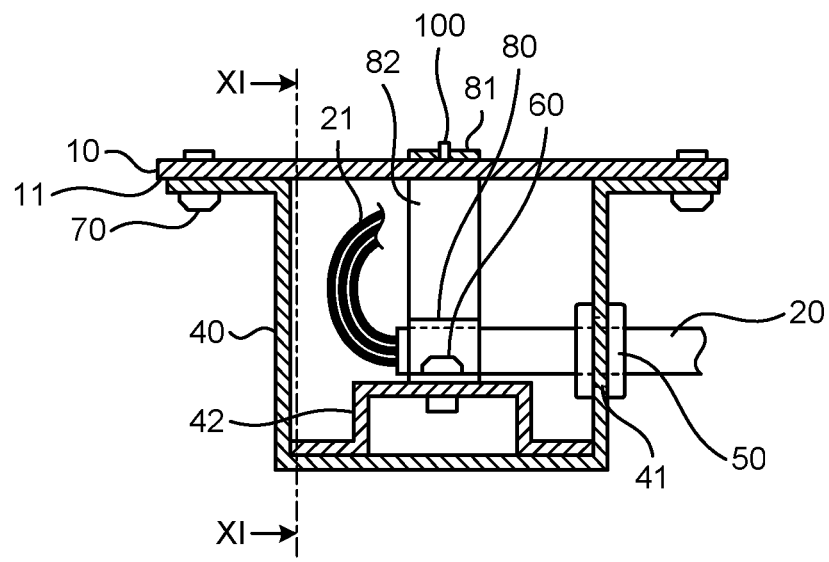
FIG. 10 is a cross-sectional view taken along line X-X illustrated in FIG. 9.
Figure 11:
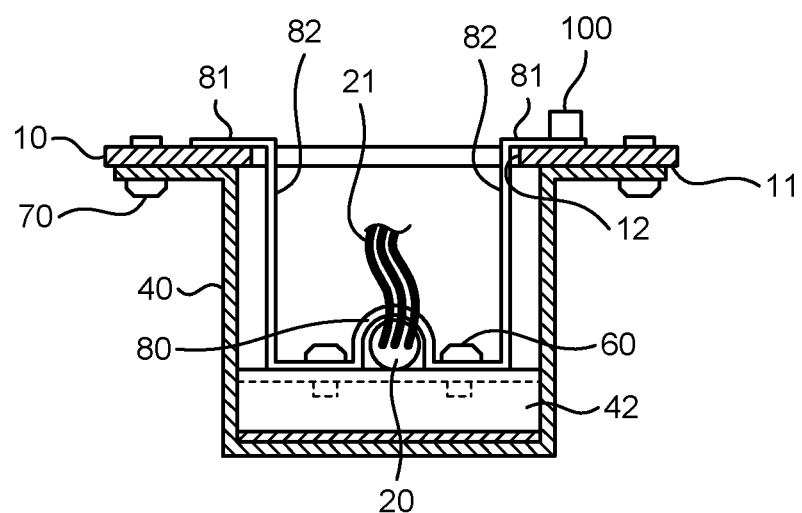
FIG. 11 is a cross-sectional view taken along line XI-XI illustrated in FIG. 10.

FIG. 9 is a plan view illustrating a wire lead-out structure of a power conversion device according to a third embodiment of the present invention. FIG. 10 is a cross-sectional view taken along line X-X illustrated in FIG. 9. FIG. 11 is a cross-sectional view taken along line XI-XI illustrated in FIG. 10. The power conversion device 1 according to the third embodiment includes a rotation stopper 100 that prevents excessive rotation of the cover component 40. In the third embodiment, like constituent elements as those of the first and second embodiments are denoted by like reference signs and configurations different from those of the first and second embodiments are mainly described.

The rotation stopper 100 is erected at a single location around the opening 12 on the inner surface of the casing 10. The rotation stopper 100 is provided at a position that notches 83 of the bent portions 81 can reach when the cover component 40 is rotated about the position of the cover component 40 at which the wire 20 is fixed. The notches 83 are provided at the end portions of the bent portions 81. The notch 83 is a portion with a notched shape conforming to the shape of the rotation stopper 100. The notch 83 is provided on each of the two bent portions 81.

FIG. 9 illustrates an example of the wire lead-out structure in which the cover component 40 is in the reference state. In this reference state, one of the two notches 83 is brought into contact with the rotation stopper 100. In the example illustrated in FIG. 9, the rotation stopper 100 prevents the cover component 40 from rotating in the counterclockwise direction from the reference state. When the cover component 40 is rotated in the clockwise direction by 180 degrees from the reference state, the other of the two notches 83 comes into contact with the rotation stopper 100. This structure prevents further rotation of the cover component 40 in the clockwise direction after the cover component 40 has been rotated in the clockwise direction by 180 degrees from the reference state.

The surface of one notch 83, which comes into contact with the rotation stopper 100, the surface of the other notch 83, which comes into contact with the rotation stopper 100, and the rotational center of the stopper plate 80 that rotates together with the cover component 40 are aligned with each other. Thus, the cover component 40 can rotate in the clockwise direction by 180 degrees from the reference state.

As described above, in the third embodiment, the cover component 40 is rotatable within the limited angular range of 180 degrees in the clockwise direction from the reference state illustrated in FIG. 9. The power conversion device 1 is provided with the rotation stopper 100 and thus can prevent the cover component 40 from being excessively rotated.

Each of the wires 21 has a length greater than the distance between the position of the stopper plate 80 and the position of the electrical component connected to the wire 21. Each of the wires 21 has a set length so as to prevent the wire 21 from being pulled excessively tight even when the cover component 40 is rotated by 180 degrees from the reference state. In the third embodiment, the power conversion device 1 is provided with the rotation stopper 100 so as to prevent the cover component 40 from rotating by an angle exceeding 180 degrees from the reference state. Due to this structure, the power conversion device 1 can reduce the likelihood that each of the wires 21 is damaged by being pulled tight by rotation of the cover component 40, while allowing rotation of the cover component 40 intended to change the orientation of the wire 20.

Fourth Embodiment

Figure 12:
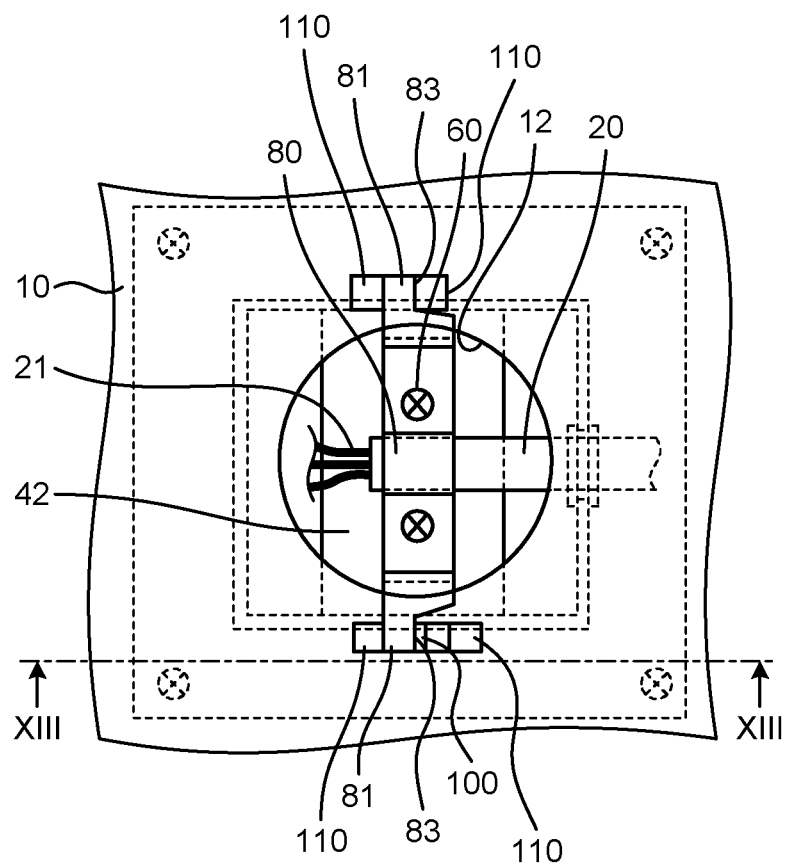
FIG. 12 is a plan view illustrating a wire lead-out structure of a power conversion device according to a fourth embodiment of the present invention.
Figure 13:
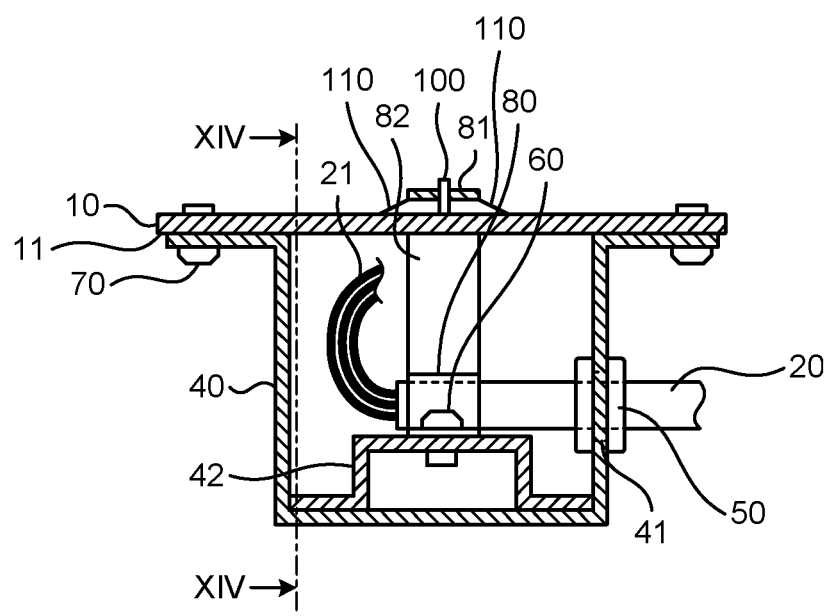
FIG. 13 is a cross-sectional view taken along line XIII-XIII illustrated in FIG. 12.
Figure 14:
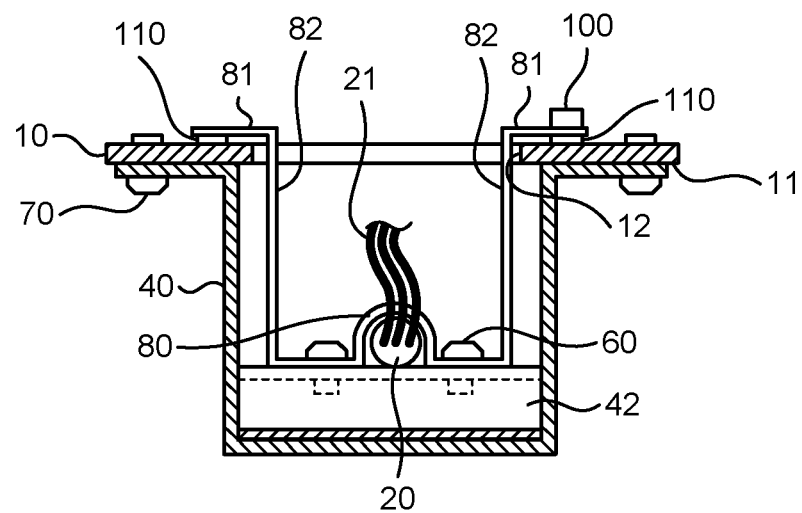
FIG. 14 is a cross-sectional view taken along line XIV-XIV illustrated in FIG. 13.

FIG. 12 is a plan view illustrating a wire lead-out structure of a power conversion device according to a fourth embodiment of the present invention. FIG. 13 is a cross-sectional view taken along line XIII-XIII illustrated in FIG. 12. FIG. 14 is a cross-sectional view taken along line XIV-XIV illustrated in FIG. 13. The power conversion device 1 according to the fourth embodiment includes protruding portions 110 used to draw the cover component 40 toward the casing 10 as the cover component 40 rotates. In the fourth embodiment, like constituent elements as those of the first to third embodiments are denoted by like reference signs and configurations different from those of the first to third embodiments are mainly described.

The protruding portion 110 is provided on each side of the rotation stopper 100 in the rotational direction of the stopper plate 80. Each of the two protruding portions 110 adjacent to the rotation stopper 100 includes an inclined surface with a greater height as the inclined surface becomes closer to the rotation stopper 100. In a state where one notch 83 is brought into contact with the rotation stopper 100, at a reach position that the other notch 83 is reached, other protruding portions 110 are provided. Each of the two protruding portions 110 adjacent to the reach position includes an inclined surface with a greater height as the inclined surface becomes closer to the reach position. The direction from the inner surface of the casing 10 opposite to the mounting surface 11 toward the center of the interior of the casing 10 is defined as a height direction.

In a state where the cover component 40 has been rotated in the clockwise direction from the reference state illustrated in FIG. 12, when the cover component 40 is rotated in the counterclockwise direction, one bent portion 81 comes into contact with the inclined surface of one protruding portion 110 before the notch 83 of this bent portion 81 reaches the rotation stopper 100. Also, the other bent portion 81 comes into contact with the inclined surface of another protruding portion 110 located 180 degrees in the rotational direction from the one protruding portion 110. When the cover component 40 is rotated until the notch 83 of the bent portion 81 reaches the rotation stopper 100, both the bent portions 81 respectively reach the protruding portions 110 at a position higher than the inner surface of the casing 10. In the manner as described above, as the stopper plate 80 is drawn toward the center of the interior of the casing 10, the cover component 40 is drawn toward the casing 10.

Also in a case where the cover component 40 is rotated clockwise from the reference state and consequently the notch 83 of the other bent portion 81 reaches the rotation stopper 100, the other bent portion 81 comes into contact with the inclined surface of the protruding portion 110. When the cover component 40 is rotated until the notch 83 of the other bent portion 81 reaches the rotation stopper 100, both the bent portions 81 respectively reach the protruding portions 110 at a position higher than the inner surface of the casing 10. In the manner as described above, as the stopper plate 80 is drawn toward the center of the interior of the casing 10, the cover component 40 is drawn toward the casing 10.

In the fourth embodiment, when the cover component 40 is brought into the reference state and when the cover component 40 is rotated by 180 degrees from the reference state, the cover component 40 is drawn toward the casing 10. The cover component 40 is drawn toward the casing 10, so that the gap between the mounting surface 11 and the flange 43 is reduced. When the cover component 40 is attached to the mounting surface 11, the gap between the mounting surface 11 and the flange 43 is reduced. This facilitates alignment of the holes 44 in the cover component 40 through which the screws 70 pass with the holes in the casing 10 through which the screws 70 are screwed. This makes it possible for the power conversion device 1 to easily attach the cover component 40 to the casing 10.

In the second to fourth embodiments, the power conversion device 1 uses the stopper plate 80 to make it possible for the cover component 40 to come into close contact with the mounting surface 11. It is allowable that the cover component 40 is fixed to the casing 10 using the stopper plate 80 without using the screws 70. It is also allowable that the stopper plate 80 is a combination of a component serving as the flat spring portion and a component serving as the bent portion 81 and the wall portion 82. When the flat spring portion of the stopper plate 80 is a component separate from the bent portion 81 and the wall portion 82, it is possible to perform attachment of the flat spring portion separately from placement of the bent portion 81 and the wall portion 82. This can improve flexibility in assembly of the wire lead-out structure.

Fifth Embodiment

Figure 15:
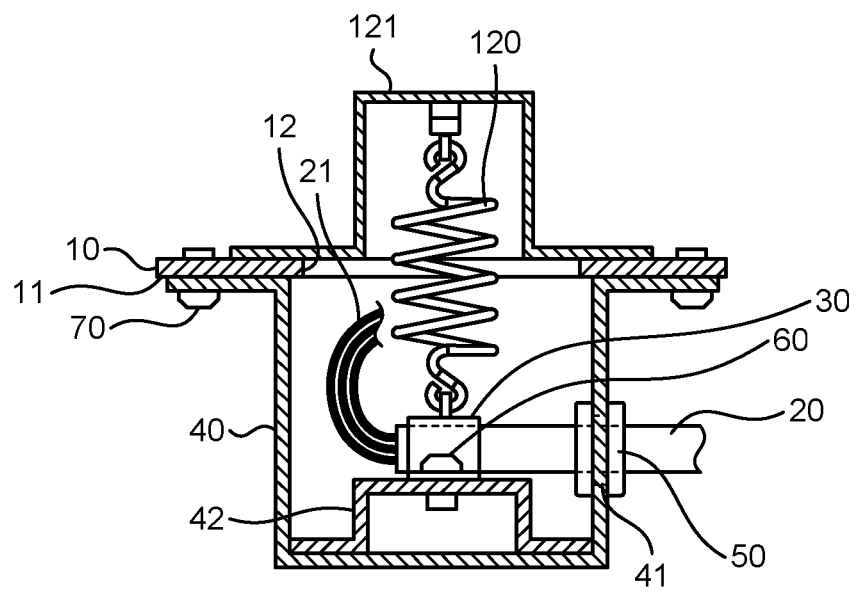
FIG. 15 is a cross-sectional view illustrating a section of a power conversion device according to a fifth embodiment of the present invention, in which a wire lead-out structure is provided.

FIG. 15 is a cross-sectional view illustrating a section of a power conversion device according to a fifth embodiment of the present invention, in which a wire lead-out structure is provided. The power conversion device 1 according to the fifth embodiment includes a spring 120 that is an elastic member that pulls the cover component 40 toward the casing 10. In the fifth embodiment, like constituent elements as those of the first to fourth embodiments are denoted by like reference signs and configurations different from those of the first to fourth embodiments are mainly described.

One end of the spring 120 is connected to a structure 121 attached to the inner surface of the casing 10. The other end of the spring 120 is connected to the pressing plate 30 provided inside the cover component 40. In this manner, the spring 120 passes through the opening 12 from the interior of the casing 10 and is connected to the interior of the cover component 40.

In the fifth embodiment, the cover component 40 is pulled toward the casing 10 by the spring 120. The cover component 40 is pulled toward the casing 10, so that the gap between the mounting surface 11 and the flange 43 is reduced. When the cover component 40 is attached to the mounting surface 11, the gap between the mounting surface 11 and the flange 43 is reduced. This facilitates alignment of the holes 44 in the cover component 40 through which the screws 70 pass with the holes in the casing 10 through which the screws 70 are screwed. This makes it possible for the power conversion device 1 to easily attach the cover component 40 to the casing 10.

In the fifth embodiment, the power conversion device 1 uses the spring 120 to make it possible for the cover component 40 to come into close contact with the mounting surface 11. It is allowable that the cover component 40 is fixed to the casing 10 using the spring 120 without using the screws 70.

Sixth Embodiment

Figure 16:
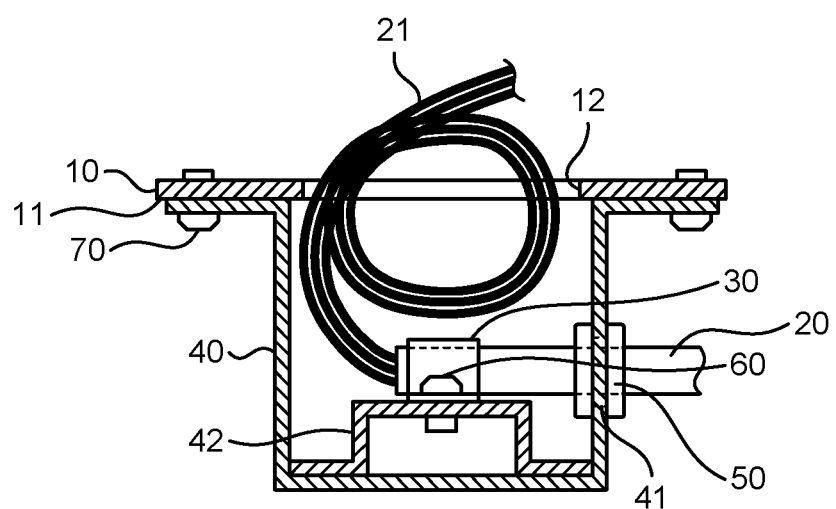
FIG. 16 is a cross-sectional view illustrating a section of a power conversion device according to a sixth embodiment of the present invention, in which a wire lead-out structure is provided.

FIG. 16 is a cross-sectional view illustrating a section of a power conversion device according to a sixth embodiment of the present invention, in which a wire lead-out structure is provided. In the sixth embodiment, a part of the wire 21, situated closer to the electrical component than the other part of the wire 21 pressed against the seat 42 by the pressing plate 30, has a length sufficient to form a loop. In the sixth embodiment, like constituent elements as those of the first to fifth embodiments are denoted by like reference signs and configurations different from those of the first to fifth embodiments are mainly described.

FIG. 16 illustrates a state where the wires 21 form loops in a configuration identical to the configuration according to the first embodiment. An allowable bend radius recommended by the manufacturer of the wires 21 is set for each of the wires 21. Each of the wires 21 has a length sufficient to form a loop with a bend radius greater than the allowable bend radius set for the wires 21.

In the sixth embodiment, the wires 21 form loops, and it is thus possible to smoothly pull and extend the wires 21 or smoothly bend the wires 21 when the cover component 40 is detached from the casing 10 and when the cover component 40 is rotated. Due to this structure, the power conversion device 1 can reduce damage to each of the wires 21. The power conversion device 1 can reduce the likelihood that the wires 21 are pulled tight by the electrical component, and thus can reduce problems such as wire breakage.

In the configurations of the second to fifth embodiments, the wires 21 may form loops similarly to the sixth embodiment. Due to this configuration, in the second to fifth embodiments as well, the power conversion device 1 can reduce damage to each of the wires 21 and reduce problems such as wire breakage.

The configurations described in the above embodiments are only examples of the content of the present invention. The configurations can be combined with other well-known techniques, and part of each of the configurations can be omitted or modified without departing from the scope of the present invention.

REFERENCE SIGNS LIST 1 power conversion device, 10 casing, 11 mounting surface, 12 opening, 20, 21 wire, 22 connector, pressing plate, 31, 44 hole, 40 cover component, 41 wiring hole, 42 seat, 43 flange, 45 surface, 50 bush, 60, 70 screw, 80 stopper plate, 81 bent portion, 82 wall portion, 83 notch, 100 rotation stopper, 110 protruding portion, 120 spring, 121 structure.

The invention claimed is:

1. A power conversion device comprising:
a wire connected to an electrical component;
a casing to accommodate the electrical component, the casing including a mounting surface that is one surface provided with an opening through which the wire is led out;
a cover component removably attached to the mounting surface to cover the opening, and provided with a wiring hole through which the wire passes;
a fixing component to fix the wire inside the cover component, the fixing component including a wall portion extending from a portion fixed inside the cover component toward interior of the casing through the opening, and a bent portion that is bent and extends from the wall portion, the bent portion facing an inner surface of the casing; and
a rotation stopper provided at a position that the bent portion is reachable when the cover component is rotated about a position at which the wire is fix, wherein
in a state where the cover component is detached from the casing, the cover component is rotated about a position at which the fixing component presses against the wire and then the cover component is fixed, so that the cover component is attachable such that an orientation of the wire led out of the opening is changed in two or more different orientations.

2. The power conversion device according to claim 1, wherein the cover component is a box member with an open side that is in contact with the mounting surface.

3. The power conversion device according to claim 1, wherein a length of the wire between the fixing component and the electrical component is greater than a distance between a position of the fixing component and a position of the electrical component.

4. The power conversion device according to claim 1, wherein the bent portion is provided with a notch having a notched shape conforming to a shape of the rotation stopper.

5. The power conversion device according to claim 1, comprising a protruding portion used to draw the cover component toward the casing as the cover component is rotated until the bent portion reaches the rotation stopper.

6. The power conversion device according to claim 1, wherein a part of the wire situated closer to the electrical component than another part of the wire fixed by the fixing component has a length sufficient to form a loop.

7. The power conversion device according to claim 6, wherein a part of the wire situated closer to the electrical component than another part of the wire fixed by the fixing component has a length sufficient to form a loop with a bend radius greater than an allowable bend radius set for the wire.

8. A power conversion device, comprising
a wire connected to an electrical component
a casing to accommodate the electrical component, the casing including a mounting surface that is one surface provided with an opening through which the wire is led out;
a cover component removably attached to the mounting surface to cover the opening, and provided with a wiring hole through which the wire passes;
a fixing component to fix the wire inside the cover component and
an elastic member to pull the cover component toward the casing, the elastic member passing through the opening from interior of the casing and being connected to interior of the cover component,
wherein in a state where the cover component is detached from the casing, the cover component is rotated about a position at which the fixing component presses against the wire and then the cover component is fixed, so that the cover component is attachable such that an orientation of the wire led out of the opening is changed in two or more different orientations.

* * * * *